(12) United States Patent
Brenner

(10) Patent No.: US 7,166,546 B2
(45) Date of Patent: Jan. 23, 2007

(54) PLANARIZATION FOR INTEGRATED CIRCUITS

(75) Inventor: Michael F. Brenner, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/923,435

(22) Filed: Aug. 20, 2004

(65) Prior Publication Data

US 2005/0020046 A1    Jan. 27, 2005

Related U.S. Application Data

(60) Division of application No. 10/195,678, filed on Jul. 15, 2002, which is a continuation-in-part of application No. 10/113,008, filed on Mar. 29, 2002.

(51) Int. Cl.
*H01L 21/47* (2006.01)
(52) U.S. Cl. ............... 438/781; 438/778; 438/780; 438/784; 257/E21.259
(58) Field of Classification Search ............ 438/778, 438/780, 781, 784; 257/E21.259
See application file for complete search history.

(56) References Cited

U.S. PATENT DOCUMENTS

| 4,514,583 A | * | 4/1985 | Izu et al. ............ 136/259 |
|---|---|---|---|
| 5,516,721 A | | 5/1996 | Galli et al. |
| 5,861,331 A | | 1/1999 | Chien |
| 5,945,254 A | | 8/1999 | Chien et al. |
| 5,985,752 A | | 11/1999 | Chang |
| 6,033,977 A | * | 3/2000 | Gutsche et al. ......... 438/618 |
| 6,159,611 A | * | 12/2000 | Lee et al. ............ 428/473.5 |
| 6,191,053 B1 | | 2/2001 | Chun et al. |
| 2003/0186536 A1 | | 10/2003 | Brenner |

OTHER PUBLICATIONS

Wolf "Silicon Processing for the VLSI era vol. 2 process integration" 1990 Lattice press pp. 214-215.*
http://semiconductorglossary.com/default.asp?searchterm=extrusion+coating.*
http://semiconductorglossary.com/default.asp?searchterm=spin%Don+deposition%2C+spin+coating.*
Jaeger, R.C., "Introduction to Microelectronic Fabrication," Modular Series on Solid Devices, vol. V, 1988, p. 21, Addison-Wesley Publishing Company, Inc.
DeForest, W.S., "Photoresist Materials and Processes," 1975, pp. 2, 3, 23 & 48, McGraw-Hill Book Company.

* cited by examiner

*Primary Examiner*—B. William Baumeister
*Assistant Examiner*—Steven J. Fulk
(74) *Attorney, Agent, or Firm*—Charles A. Brill; Wade James Brady, III; Frederick J. Telecky, Jr.

(57) ABSTRACT

A method of planarizing a layer of an integrated circuit. In one embodiment, a liquid film is applied over the layer, using extrusion coating techniques. In another embodiment, the layer itself may be applied as a liquid film, using extrusion techniques.

17 Claims, 2 Drawing Sheets

PLANARIZATION FOR INTEGRATED CIRCUITS

RELATED APPLICATION

This application is a divisional of application Ser. No. 10/195,678, filed Jul. 15, 2002, which is a continuation-in-part application of application. Ser. No. 10/113,008 filed Mar. 29, 2002 and entitled "Via Formation in Integrated Circuits By Use of Sacrificial Structures."

TECHNICAL FIELD OF THE INVENTION

This invention relates to fabrication of integrated circuits, and more particularly to a method for planarizing surfaces of integrated circuit layers.

BACKGROUND OF THE INVENTION

A typical digital integrated circuit comprises a number of transistors and other electrical elements. The integrated circuit chip is a sandwiched structure made up of the silicon substrate, dielectric layers, metal interconnects, devices and so on. The layers are formed by various deposition, photolithographic, and etching techniques.

Advances in integrated circuit capacity and complexity depend on increases in the density of semiconductor devices and layering of metal circuitry. Each layer must be planarized prior to the next lithography step to achieve desired device performance. Deposition means such as chemical vapor deposition or spin coating are conformal, which requires them to be subsequently planarized.

To ensure flatness, manufacturers typically use chemical mechanical planarization (CMP), which is essentially a chemical polishing process. Another approach to planarization is contact planarization, which involves the application of a malleable coating on the surface of a chip; the coating then is pressed against an optically clear, flat surface and cured with ultraviolet light. The coating may be left in place or removed, leaving the flat substrate.

SUMMARY OF THE INVENTION

One aspect of the invention is a method of planarizing a layer of an integrated circuit. A liquid film is applied over the layer, using extrusion coating techniques. In another embodiment, the layer itself may be applied as a liquid film, using extrusion coating techniques.

An advantage of the invention is that the extrusion coating is "self-planarizing". No subsequent planarization steps are needed. As a result, clean-up steps are eliminated and defects are reduced.

DETAILED DESCRIPTION OF THE INVENTION

The following description is directed to a method of planarizing one or more layers of an integrated circuit. For purposes of example, the planarization is performed for an insulating layer, through which there is a via. In the example below, the layer in question is applied using extrusion techniques. In other embodiments, a layer of another material could be planarized by applying an extrusion coating on the surface of that layer.

"Extrusion" coating is meant here in its conventional sense. The extruder is mounted above the substrate, and liquid is forced through a die onto the substrate. In the extrusion coating of a hot melt liquid, the liquid is fed into an extruder, and pumped to the substrate. Alternatively, granules of solid form of the liquid are fed into an extruder, where they are melted and homogenised before being pumped through the die. Typically, then, the coating is a hot melt liquid applied at an elevated temperature. The extruder is motion relative to the substrate, thinner coatings can be produced where the line speed is faster than the speed of the extrusion.

Figure 1:
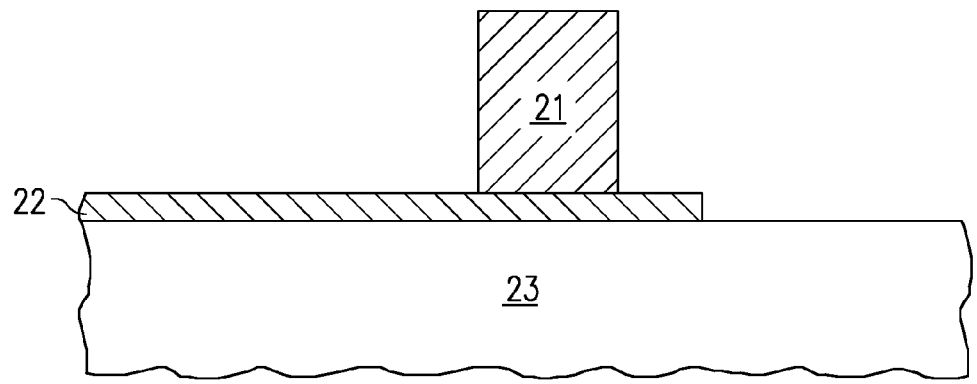
FIG. 1 illustrates the formation of pillar-like structures over a metal lead of an integrated circuit.

FIG. 1 illustrates the formation of a pillar 21 over a metal line 22, which has already been patterned on a semiconductor substrate 23. Pillar 21 may be formed from photoresist, using conventional lithographic techniques, including patterning and etching. The material used to form pillar 21 is typically photoresist, but may be any "sacrificial" material, that may subsequently be removed as explained below. Pillar 21 need not be column-shaped, but rather may be any structure having a shape such that when sacrificially removed, will form a via.

Figure 2:
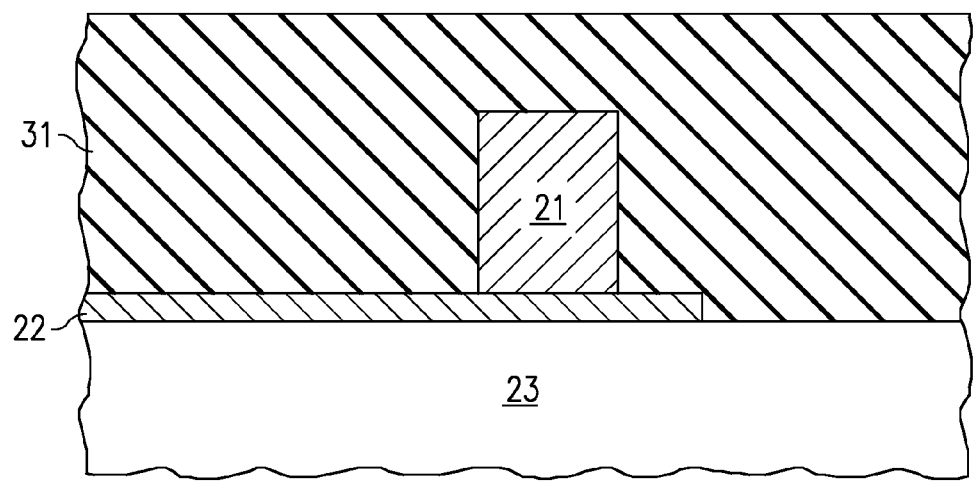
FIG. 2 illustrates the application of an insulating layer over the pillar-like structure.

FIG. 2 illustrates the application of an insulating layer 31. As illustrated, insulating layer 31 encapsulates pillar 21. Insulating layer 31 may be any material suitable for an interlevel dielectric layer of an integrated circuit.

Extrusion coating is especially desirable for applying layer 31 because of its ability to provide a planarized surface. In contrast, other deposition methods, such as chemical vapor deposition or spin coating, are conformal and require an etch back or chemical mechanical planarization to achieve a desired planar surface.

For extrusion coating, the desired material may be applied in the form of a solution gel or liquid film. For liquid films applied by extrusion coating, application of the film may be followed by other processing, such as thermal or photochemical steps, in which the uniformity achieved through deposition is maintained. During these subsequent process steps, the chemical or physical structures of the film or underlying layers or interfaces may change, that is, these steps have a curing effect.

Experimental testing with extrusion coating has indicated that surface features may be coated and planarized to less than 250 angstroms. The same features covered by a spin coating typically result in nonplanarities of approximately 1800 angstroms.

Figure 3:
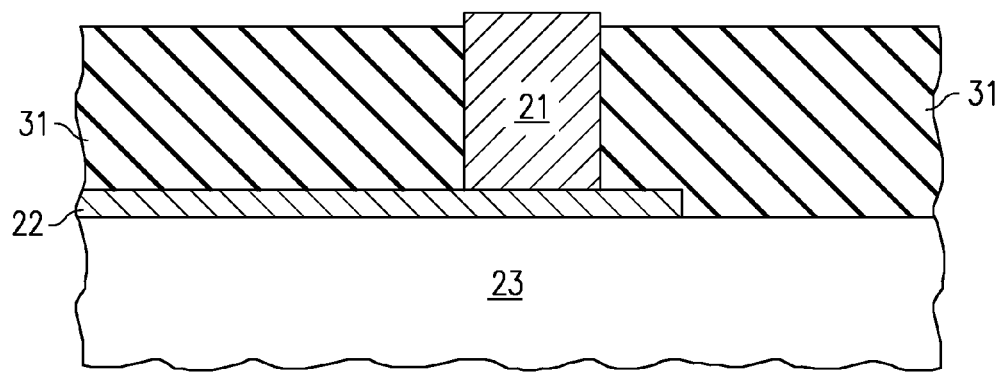
FIG. 3 illustrates the removal of a portion of the insulating layer to expose the top of the pillar-like structure.

FIG. 3 illustrates an etch back of insulating layer 31 to expose pillar 21. The etch may be either a wet or dry etch, such as a wet chemical or dry plasma etch. The etching is performed for a duration sufficient to expose at least the top surface of pillar 21.

Figure 4:
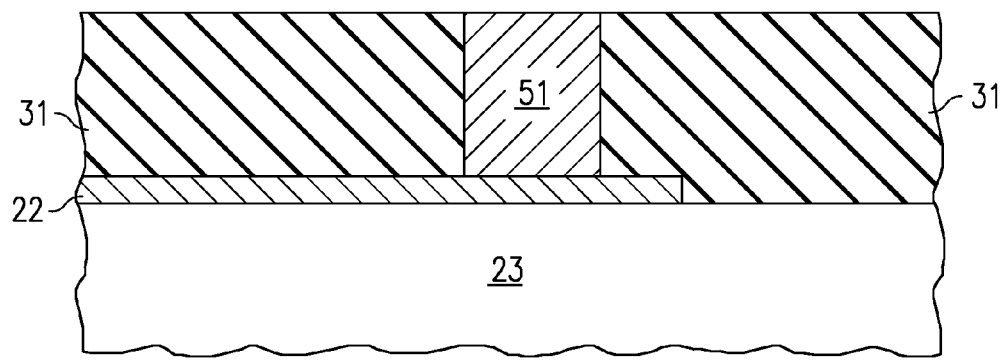
FIG. 4 illustrates removal of the pillar-like structure.
Figure 5:
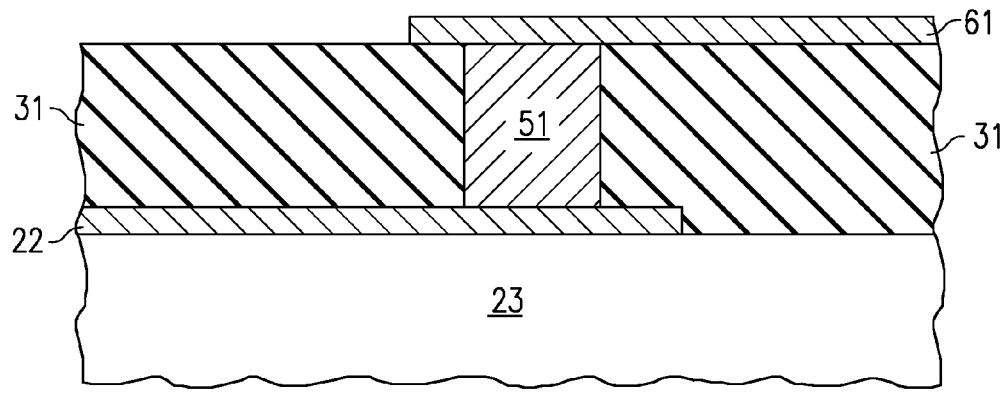
FIG. 5 illustrates formation of a conductive line.

FIG. 4 illustrates the removal of pillar 21. This may be achieved with a relatively gentle etch, such as a gentle plasma etch. This type of plasma etch is commonly called an ash process, but other selective isotropic etches may be used, if suitable for removing the material from which pillar 21 is made may be used. The avoidance of anisotropic etching eliminates etch residue issues. After the sacrificial structure, that is, pillar 21 has been removed, a via 51 is formed in layer 31 and extends to metal line 22. As shown in FIG. 5, a conductive line 61 can be formed over via 51 and layer 31.

OTHER EMBODIMENTS

Although the present invention has been described in detail, it should be understood that various changes, substitutions, and alterations can be made hereto without departing from the spirit and scope of the invention as defined by the appended claims.

What is claimed is:

1. A method of forming a conductive region in an integrated circuit, the method comprising:
   providing a semiconductor substrate with a conductive region formed thereon;
   forming a sacrificial material over the conductive region;
   forming an insulating layer over the sacrificial material by coating the substrate using an extrusion coating process to apply a liquid film;
   removing the sacrificial material such that a recess is formed in the insulating layer; and
   forming a conductive material in the recess.

2. The method of claim 1 and further comprising curing the liquid film.

3. The method of claim 2 wherein curing the liquid film comprises performing a thermal step.

4. The method of claim 2 wherein curing the liquid film comprises performing a photochemical step.

5. A method of forming a conductive region in an integrated circuit, the method comprising:
   providing a semiconductor substrate with a conductive region formed thereon;
   forming a sacrificial material over the conductive region;
   forming an insulating layer over the sacrificial material by coating the substrate using an extrusion coating process to apply a solution gel;
   removing the sacrificial material such that a recess is formed in the insulating layer; and
   forming a conductive material in the recess.

6. A method of forming a conductive region in an integrated circuit, the method comprising:
   providing a semiconductor substrate with a conductive region formed thereon;
   forming a sacrificial material over the conductive region;
   forming an insulating layer over the sacrificial material by coating the substrate using an extrusion coating process;
   performing an ash process to remove the sacrificial material, such that a recess is formed in the insulating layer; and
   forming a conductive material in the recess.

7. The method of claim 6 wherein the sacrificial material comprises photoresist.

8. The method of claim 6 wherein the sacrificial material is shaped in a pillar like structure.

9. The method of claim 6 wherein forming an insulating layer comprises forming a layer that is planarized to less than 250 angstroms.

10. The method of claim 6 and further comprising etching back the insulating layer to expose a top surface of the sacrificial material.

11. The method of claim 6 wherein forming a conductive material comprises forming a via in electrical contact with the conductive region.

12. A method of forming a conductive region in an integrated circuit, the method comprising:
    providing a semiconductor substrate with a conductive region formed thereon;
    forming a sacrificial material over the conductive region;
    forming an insulating layer over the sacrificial material by coating the substrate using an extrusion coating process;
    performing an isotropic etch to remove the sacrificial material, such that a recess is formed in the insulating layer; and
    forming a conductive material in the recess.

13. The method of claim 12 wherein the sacrificial material comprises photoresist.

14. The method of claim 12 wherein the sacrificial material is shaped in a pillar like structure.

15. The method of claim 12 wherein forming an insulating layer comprises forming a layer that is planarized to less than 250 angstroms.

16. The method of claim 12 and further comprising etching back the insulating layer to expose a top surface of the sacrificial material.

17. The method of claim 12 wherein forming a conductive material comprises forming a via in electrical contact with the conductive region.

* * * * *